(12) United States Patent
Yamauchi

(10) Patent No.: US 6,294,232 B1
(45) Date of Patent: Sep. 25, 2001

(54) SEMICONDUCTOR LASER DIODE CHIP AND ITS POSITIONING AND MOUNTING METHOD

(75) Inventor: Kenji Yamauchi, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/387,268

(22) Filed: Aug. 31, 1999

(30) Foreign Application Priority Data

Sep. 3, 1998 (JP) .................................................. 10-249331

(51) Int. Cl.[7] .................................................. H01L 21/00
(52) U.S. Cl. .................................................. 428/27; 385/88
(58) Field of Search .................................. 385/88; 438/27

(56) References Cited

U.S. PATENT DOCUMENTS

| 5,042,709 | 8/1991 | Cina et al. . |
| 5,414,787 | * 5/1995 | Kurata ..................................... 385/92 |
| 5,790,737 | * 8/1998 | Aoyagi et al. ........................ 385/131 |

FOREIGN PATENT DOCUMENTS

| 0 701 156 A2 | 3/1996 | (EP) . |
| 0 840 154 A1 | 5/1998 | (EP) . |
| 5-14577 | 6/1993 | (JP) . |
| 9-145965 | 6/1997 | (JP) . |
| 9-148623 | 6/1997 | (JP) . |
| 10-144998 | 5/1998 | (JP) . |
| 10-256664 | 9/1998 | (JP) . |
| 11-238936 | 8/1999 | (JP) . |

OTHER PUBLICATIONS

Lee et al., Quantitative Evaluation of Passive–Aligned Laser Diode–to–Fiber Coupling, 1998 Electronic Component and Technology Conference, pp. 1459–1463.*

European Search Report dated Mar. 6, 2000.

Lee S H et al, Quantitative Evaluation of Passive–Aligned Laser Diode–To–Fiber Coupling, 1998 Electronic Components and Technology Conference, pp. 1459–1463.

Tanaka K et al, "High Optical Coupling Scheme In LD Modules with Silicon Platform Technology" pp. 107–111, Jan. 1997.

* cited by examiner

Primary Examiner—Olik Chaudhuri
Assistant Examiner—Douglas A. Wille
(74) Attorney, Agent, or Firm—McGinn & Gibb, PLLC

(57) ABSTRACT

Positioning marks 15, 16 are formed at predetermined positions with respect to an active layer 11 buried in an LD chip body 10. In an Au metallized layer 12 for solder joining on the active layer 11, marks 17, 18 for measurement are precisely formed by the same mask with which the positioning marks 15, 16 are formed. The marks 17, 18 for measurement are arranged closer to the active layer 11 in comparison with the positioning marks 15, 16. Therefore, the distances between the active layer 11 and the marks 17, 18 for measurement can be respectively measured with high accuracy. In mounting of the LD chip to a substrate in a passive alignment technique, relative positions of the active layer and the positioning marks are measured in advance with high accuracy and the LD chip can be mounted to the substrate by correcting both the relative positions. Thus, the LD chip is positioned with high accuracy to be mounted to the substrate. The LD chip and an optical waveguide, or an optical fiber arranged in the substrate, can be coupled to each other with high coupling efficiency.

11 Claims, 6 Drawing Sheets

SEMICONDUCTOR LASER DIODE CHIP AND ITS POSITIONING AND MOUNTING METHOD

BACKGROUND OF THE INVENTION

1. Field of the Invention

The present invention relates to a semiconductor laser diode chip (an LD chip), and to a method for mounting this semiconductor laser diode chip onto a substrate. In particular, the present invention relates to an LD chip and its mounting method suitable for a passive alignment technique without performing optical coupling to an optical waveguide and an optical fiber by emitting light from the LD chip.

2. Description of the Related Art

An LD chip is, conventionally, optically coupled to an optical waveguide formed on a substrate, or to an optical fiber arranged on the substrate by monitoring intensity of light outputted from the optical fiber in an oscillating state of the LD chip, and performing a positioning operation such that the light intensity is maximized. However, it is necessary to flow an electric current through the LD chip to oscillate the LD chip. Further, productivity is low since it is also necessary to make a position adjustment while the light intensity outputted from the optical fiber is monitored. In particular, when the LD chip is optically coupled to the optical waveguide and an adjusting mechanism is arranged, the structure becomes complicated and it is difficult to monitor in advance light outputted from the optical waveguide.

Therefore, mainly in a module in which the LD chip and the optical waveguide are optically coupled to each other, the consideration of an assembly technique called a passive alignment mounting technique is forwarded instead of the above method to reduce the number of assembly works. For example, a construction described in U.S. Pat. No. 5,414,787 is known as a construction relative to positioning of the LD chip and its mounting method by the passive alignment technique. In the passive alignment technique, a coupling technique of the LD chip and the optical fiber is constructed by fixedly mounting a semiconductor laser and the optical fiber at respective predetermined positions, and it is not necessary to adjust an optical axis. Accordingly, it is not necessary to oscillate the LD chip in the passive alignment technique, either. However, in any technique, it is normally necessary to perform a mounting operation with sub-$\mu$m accuracy to couple with sufficient efficiency the semiconductor laser and the optical fiber to each other.

In the LD chip used in the mounting method using the conventional passive alignment technique, a positioning mark is formed on a substrate-side face of the LD chip. This mark is normally formed of a metallized layer. In the mounting method of the LD chip using the passive alignment technique, it is necessary to accurately recognize the position of an active layer buried in a semiconductor laser body to mount the LD chip to the substrate with high accuracy.

No active layer can be normally confirmed directly by its outward appearance. Therefore, a positioning mark is formed on a surface of the LD chip body. The LD chip is positioned by confirming the positioning mark. Accordingly, relative position accuracy of the positioning mark to the active layer is very important in the passive alignment.

However, at a position facing the active layer, it is necessary to perform solder joining to a heat sink such as a silicon (Si) substrate in order to radiate heat. Accordingly, an Au metallized layer 2 for the solder joining is formed in the position facing the active layer. Therefore, it is difficult to pattern a mark requiring a certain wide area such as the positioning mark. Accordingly, in the conventional LD chip, the distance between the positioning mark and the active layer is as far as 50 $\mu$m to 100 $\mu$m.

A method of directly measuring position accuracy by observing a section of the LD chip body is most accurate to confirm the relative positions of the active layer of the LD chip and the positioning mark of the LD chip. However, in the conventional LD chip, since the distance between the positioning mark and the active layer is 50 $\mu$m to 100 $\mu$m, a measurement error in measuring the relative position accuracy of the positioning mark to the active layer is as large as 2 to 3 $\mu$m, or more. Therefore, no sufficient recognizing accuracy can be obtained with respect to mounting using the passive alignment technique requiring sub-$\mu$m accuracy.

SUMMARY OF THE INVENTION

An object of a mounting method of an LD chip of the present invention is to make it possible to mount the LD chip to a substrate with high positioning accuracy by a passive alignment technique.

To achieve the above object, in a mounting method of an LD chip in the present invention, a positioning mark is formed in a predetermined position with respect to an active layer on the surface of an LD chip body in which the active layer is buried. In the LD chip, a mark for measuring relative position of the active layer to the positioning mark is positioned in the vicinity of the active layer on the body surface with respect to the positioning mark in a metallic layer.

More concretely, in the mounting method of the LD chip for mounting the semiconductor laser diode chip (LD chip) having the active layer to a substrate in its predetermined position, the semiconductor laser diode has a mark for measurement (first mark) formed in the vicinity of the active layer and a mark for positioning (second mark) that is provided for positioning with respect to the substrate. On the other hand, the substrate has a substrate-side positioning mark in a position opposed to the mark for measurement when the LD chip is arranged at the predetermined position. A position relation between the active layer and the mark for measurement of the LD chip is made clear by measurement in advance. Next, the LD chip is arranged on the substrate so that the mark for measurement and the substrate side mark are opposed to each other. The LD chip is fixed to the substrate while correcting a position of the LD chip on the basis of the above position relation.

Here, the mark for measurement may be arranged just above the active layer, or may be arranged just above the active layer and may be formed to have approximately the same width as that of the active layer. Otherwise, the mark for measurement may be constructed by forming a metallic layer, etc. in plural thin parallel straight lines. Further, a pair of positioning marks may be arranged in predetermined positions between which the active layer is located, and a pair of marks for measurement may be arranged with respect to the pair of positioning marks.

The positioning mark may be constructed by a mark for mounting in the passive alignment technique, or may be constructed by a mark formed by a metallic layer for solder joining, etc.

In the above mounting method, the substrate has a V-groove the center of which coincides with the central axis of the active layer. The LD chip and an optical fiber can be optically coupled to each other on the substrate with high efficiency by arranging the optical fiber in this V-groove.

BRIEF DESCRIPTION OF THE DRAWINGS

The above and other objects, features and advantages of the present invention will become more apparent from the following detailed description when taken in conjunction with the accompanying drawings wherein.

DETAILED DESCRIPTION OF THE PREFERRED EMBODIMENTS

A conventional mounting method of an LD chip in a passive alignment technique will first be explained so as to make the invention easily understood before an LD chip and its mounting method of the present invention are explained.

The passive alignment technique is a method for optically coupling the LD chip and an optical fiber by mounting and fixing a semiconductor laser and the optical fiber in respective predetermined positions. Accordingly, it is not necessary to oscillate the LD chip in the passive alignment technique. It is normally necessary to mount the LD chip to a substrate with sub-$\mu$m accuracy to couple with sufficient efficiency the LD chip and the optical fiber to each other.

Here, the conventional mounting method of the LD chip in the passive alignment technique will be explained.

Figure 1:
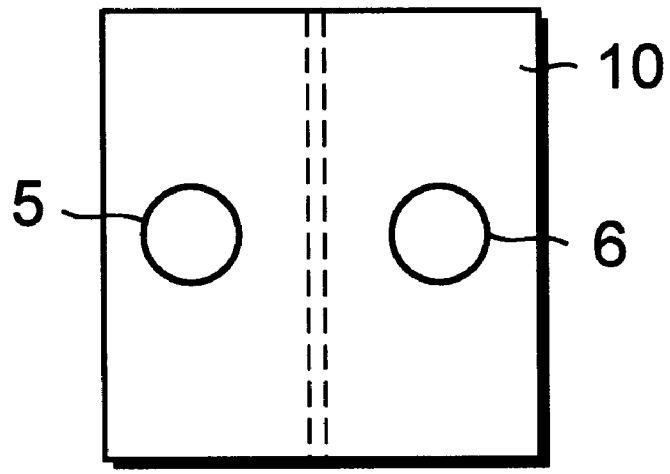
FIG. 1 is a plan view showing the structure of an LD chip used in a conventional mounting method of the LD chip.
Figure 2:
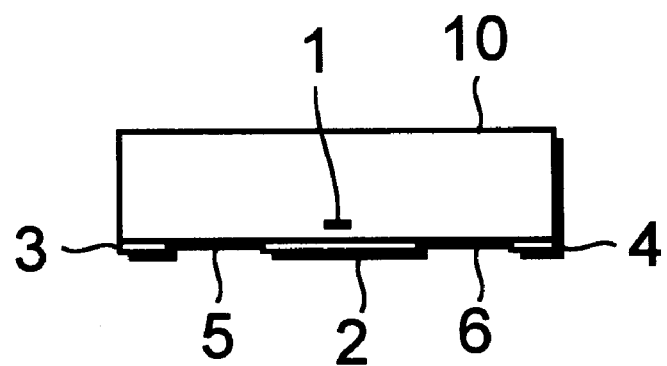
FIG. 2 is a cross-sectional view of the LD chip shown in FIG. 1.

FIGS. 1 and 2 respectively show a plan view and a cross-sectional view of a conventional LD chip in the passive alignment technique. In each of these figures, reference numeral 10 designates a body of a semiconductor laser diode having a predetermined layer structure. Reference numeral 1 designates an active layer. Reference numerals 2, 3 and 4 designate Au (gold) metallized layers. Reference numerals 5 and 6 designate positioning marks. It is necessary to accurately recognize a position of the active layer 1 buried in the semiconductor laser body in order to perform such mounting with high accuracy by the passive alignment technique.

No active layer 1 can be normally confirmed directly by its outward appearance. Therefore, there is a known mounting method in which the marks 5 and 6 for positioning are formed on a surface of the diode body 10, and the semiconductor laser is positioned by confirming the marks 5 and 6 for positioning. Accordingly, relative position accuracy of the positioning marks 5, 6 and the active layer 1 is very important in the passive alignment.

However, the distances between the positioning marks 5, 6 and the active layer 1 in the conventional LD chip are distant as far as 50 $\mu$m to 100 $\mu$m. It is necessary to perform solder joining to a heat sink such as a silicon (Si) substrate, at a position facing the active layer in order to radiate heat. An Au metallized layer 2 for the solder joining is formed in the position facing the active layer 1. Therefore, it is difficult to pattern a mark requiring a certain wide area such as the positioning marks 5, 6.

A method for directly measuring position accuracy by observing a section of the LD chip body is most accurate to confirm the relative positions of the active layer 1 and the positioning marks 5, 6 of the LD chip. However, in the conventional LD chip, as shown in FIGS. 1 and 2, the positioning marks 5, 6 are respectively distant from the active layer 1 by 50 $\mu$m to 100 $\mu$m. Therefore, a measurement error in measuring the relative position accuracy of the positioning marks 5, 6 and the active layer 1 is as large as 2 to 3 $\mu$m, or more. Accordingly, no sufficient recognizing accuracy can be obtained in mounting using the passive alignment technique requiring sub-$\mu$m accuracy.

A mounting method of the LD chip of the present invention will next be explained.

Figure 3:
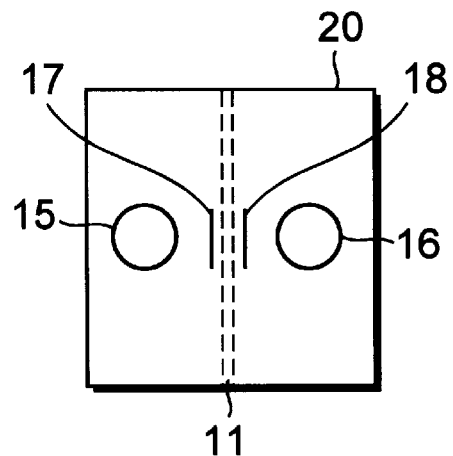
FIG. 3 is a plan view showing the structure of a first embodiment of the LD chip used in a mounting method of the LD chip of the present invention.

FIG. 3 is a plan view showing the structure of a first embodiment of the LD chip used in the mounting method of the LD chip of the present invention.

A method for directly measuring position accuracy by observing a section of the LD chip is most reliable to confirm the relative positions of an active layer 11 of the LD chip and positioning marks 15, 16. In the LD chip in this embodiment, marks 17, 18 for measurement are formed on a surface of the LD chip in the vicinity of the active layer 11 together with the positioning marks 15, 16.

Figure 4:
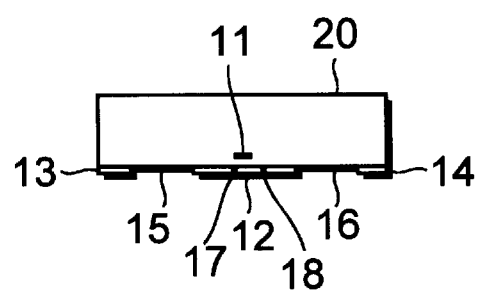
FIG. 4 is a cross-sectional view of the LD chip shown in FIG. 3.

In FIGS. 3 and 4, the active layer 11 for emitting a laser beam is formed within an LD chip body 20. The marks 17, 18 for measurement are formed in an Au metallized layer 12 in the vicinity of the active layer 11. The marks 17, 18 for measurement can be formed without having any influence on the solder joining since each of these marks is sufficiently constructed by a thin straight line of e.g., about 5 $\mu$m in width. These marks 17, 18 for measurement can be formed by the same process for forming the positioning marks 15, 16. The marks 17, 18 for measurement and the positioning marks 15, 16 are formed by using the same mask in a manufacturing process of the LD chip, so that relative positions with high accuracy ranging from 0.1 to 0.2 $\mu$m can be realized.

Accordingly, if the relative positions of the marks 17, 18 for measurement to the active layer 11 are measured, it is possible to obtain the result similar to those in a case in which relative positions of the positioning marks 15, 16 to the active layer 11 are measured. The active layer 11 can be located in the same position at any time, even when the LD chip is mounted by using the positioning marks 15, 16, by adjusting a mounting position of the LD chip in accordance with the relative position of the active layer 11 to the marks 17, 18 for measurement. For example, when the position of the active layer 11 is shifted by 1 $\mu$m from the marks 17, 18 for measurement in a direction perpendicular to the active layer 11, the position of the active layer 11 can be compensated at a position provided in accordance with a designed value by mounting the LD chip so as to shift the positioning marks 15, 16 by 1 μm onto the opposite side in mounting the LD chip.

The relative positions of the active layer 11 and the marks 17, 18 for measurement are directly measured by observing a section of the LD chip. After the LD chip extracted from a wafer is cut in section, an end face of the LD chip is etched so that an active layer portion is recessed and the position of the active layer 11 can be recognized. The marks 17, 18 for measurement are patterned with Au (gold) on a surface of the LD chip, so that the position of the active layer 11 can be confirmed by a level difference of an Au metallized layer 12 in a mark portion for measurement as shown in FIG. 4. The relative positions are measured by using an equipment such as an SEM, which is able to take a distance measurement with high accuracy while the active layer 11 and the marks 17, 18 for measurement are simultaneously observed.

When the marks 17, 18 for measurement are arranged on both sides of the active layer 11 as shown in FIG. 3, an error in absolute value at measuring time can be corrected by designing the LD chip such that the active layer 11 is located in the central position between the marks 17 and 18 for measurement on both sides. First, the distance between the mark 17 for measurement and the active layer 11, and the distance between the mark 18 for measurement and the active layer 11 are respectively measured. Thus, the distance between the marks 17 and 18 for measurement is measured in advance. The marks 17 and 18 for measurement are formed in accordance with mask accuracy at the time of formation in a semiconductor process. Therefore, when the distance between the marks 17 and 18 for measurement is designed to have 10 μm, the actual value of this distance is approximately 10 μm.

Here, for example, when the measured value of this distance is 10.5 μm, it turns out that the measured value by a used measuring technique is reduced by about 3% down to 10/10.5.

Next, the distance between the mark 17 for measurement and the active layer 11, and the distance between the mark 18 for measurement and the active layer 11 are respectively multiplied by the correction value 10/10.5 previously calculated so that true values of these distances can be calculated. The actual relative positions of the marks for measurement and the active layer can be finally calculated by comparing the distance between the mark 17 for measurement and the active layer 11, and the distance between the mark 18 for measurement and the active layer 11 which are calculated by the correction values.

The transversal distance between the active layer 11 and each of the marks for measurement can be actually set to a value equal to or smaller than 5 μm. Therefore, the relative positions can be measured with an error of about 0.2 to 0.3 μm even when measuring accuracy is set to 5%. This error amount is equal to or smaller than 1/10 times an error amount obtained in the case that measurement is made using the positioning marks 15, 16. Accordingly, the measuring accuracy can be remarkably improved.

The relative positions of the marks for measurement and the active layer are measured by sampling some from the same wafer of the LD chip. A relative position of the active layer and a surface pattern within the same wafer is very uniform in a manufacturing process of the LD chip. Therefore, if some within the wafer are sampled and position accuracy is grasped, this position accuracy can be considered as the same accuracy also in the other LD chips within the same wafer. Accordingly, shifting amounts of the relative positions of the active layer and the marks for measurement are considered as the same within the wafer, so that these shifting amounts can be used as offsets in the mounting of the LD chip.

When the marks for measurement are formed, the marks for measurement are only added to a mask pattern for forming the positioning marks. Accordingly, this addition can be realized without having any influence on the manufacturing process of the LD chip. Therefore, the marks for measurement can be formed without reducing productivity of the LD chip.

In this embodiment, the marks for measurement are formed of thin straight lines, but can be formed in various shapes as long as it does not influence the solder joining. These marks for measurement can be similarly used since a level difference in Au metallized is also caused when the marks have an arbitrary shape except for the straight line, such as a circular shape and a square shape. The absolute value can be also naturally corrected by forming the marks for measurement on both sides of the active layer.

A second embodiment of a mounting method of an LD chip of the present invention will next be explained.

Figure 5:
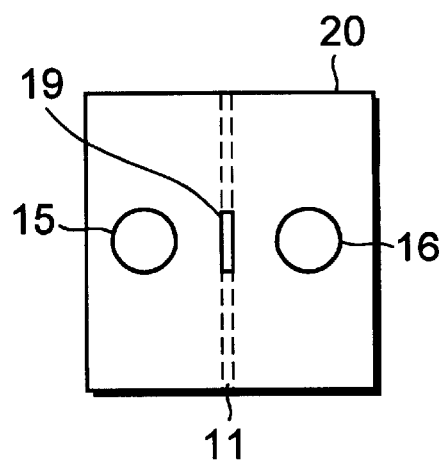
FIG. 5 is a plan view showing the structure of a second embodiment of an LD chip used in a mounting method of the LD chip of the present invention.

FIG. 5 shows the second embodiment of the mounting method of the LD chip of the present invention. As shown in FIG. 5, shifting amounts of the relative positions of positioning marks 15, 16 to an active layer 11 can be easily grasped by arranging a mark 19 for measurement just above the active layer 11. Further, relative position accuracy can be further easily grasped if a width of the mark 19 for measurement is set to be equal to a width of the active layer 11.

Figure 6:
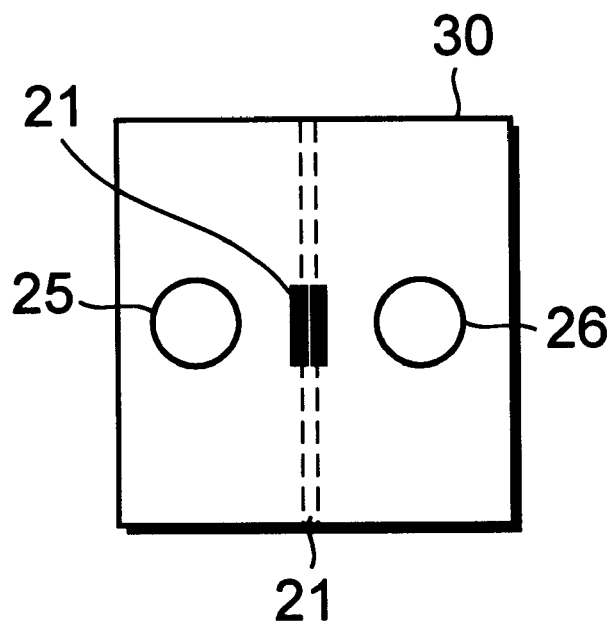
FIG. 6 is a plan view showing the structure of a third embodiment of an LD chip used in a mounting method of the LD chip of the present invention.
Figure 7:
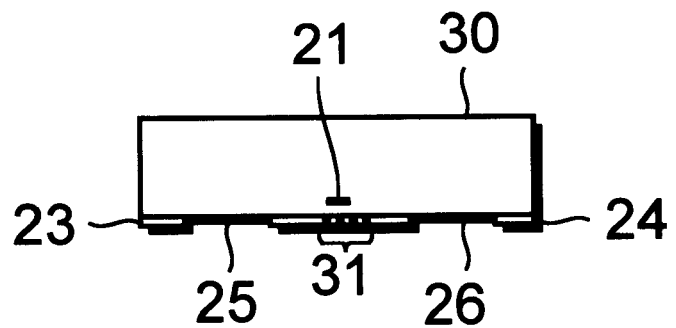
FIG. 7 is a cross-sectional view of the LD chip shown in FIG. 6.

FIGS. 6 and 7 show a third embodiment of a mounting method of an LD chip of the present invention. A mark 21 for measurement is constructed by plural thin straight lines arranged in parallel with each other so that the shifting amounts can be more reliably measured. As shown in FIG. 6, when the mark 21 for measurement is formed by arranging plural thin straight lines in parallel with each other, a section of the LD chip is formed stepwise as shown in FIG. 7. A level difference is only about 0.4 μm in the mark for measurement formed by Au metallized layer. Therefore, when the relative position is measured using one of steps as reference, there is a possibility that no level difference can be recognized from a certain cause. However, the level difference can be reliably recognized by forming plural straight lines as the mark 21 for measurement. Accordingly, the relative position of the mark for measurement to the active layer can be reliably measured. Naturally, the mark 21 for measurement is not limited to the plural thin straight lines, but shape of the mark for measurement is not particularly limited if this shape is a shape capable of forming plural level differences.

A mounting procedure in the mounting method of the LD chip of the present invention will next be explained.

Figure 8:
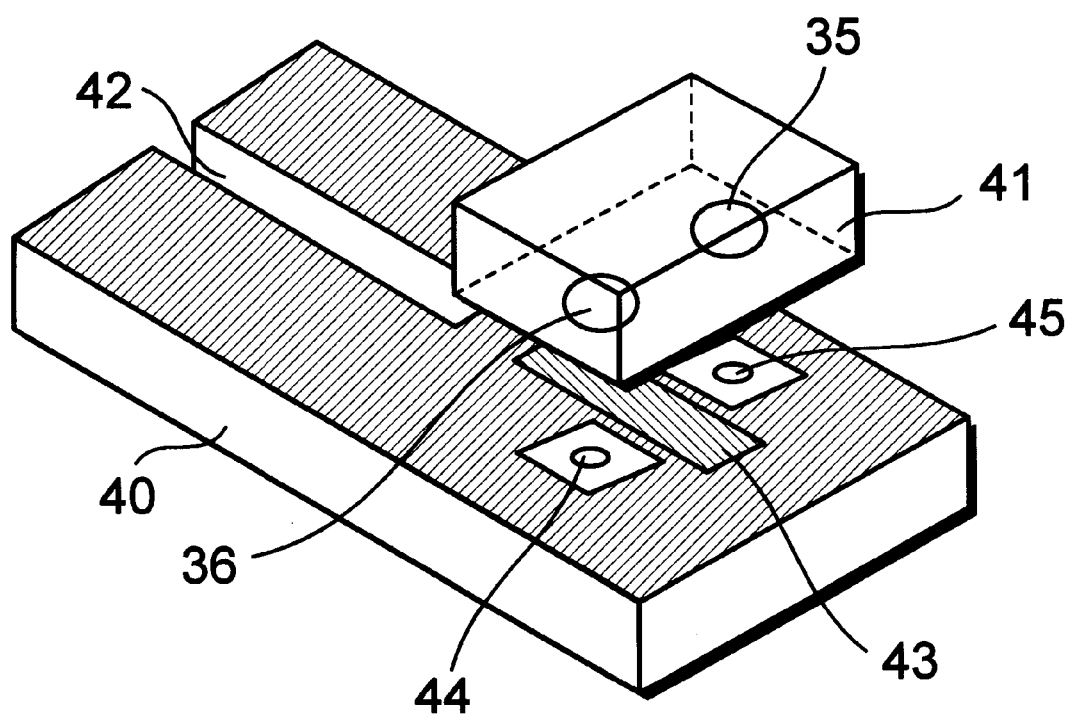
FIG. 8 is a view showing a state of an LD chip mounted to a substrate.

FIG. 8 is a view showing a state of the LD chip mounted to a substrate. In this embodiment, a V-groove 42 for arranging an optical fiber (illustration thereof is omitted) is formed in advance on a silicon substrate 40 by wet etching. An AuSn soldering layer 43 for mounting the LD chip 41 is formed on a substrate surface on the extension line of the V-groove 42. In this embodiment, the AuSn soldering layer 43 has an area larger than that of an active layer (illustration thereof is omitted) and a rectangular shape. After the LD chip 41 is mounted, the AuSn soldering layer 43 is formed at a position just below the active layer.

Positioning marks 44, 45 on the substrate side are formed on both sides of the AuSn soldering layer 43. Marks 37, 38 for measurement which are already explained are formed on the substrate-side face of the LD chip 41 (not shown in the drawings).

Figure 9:
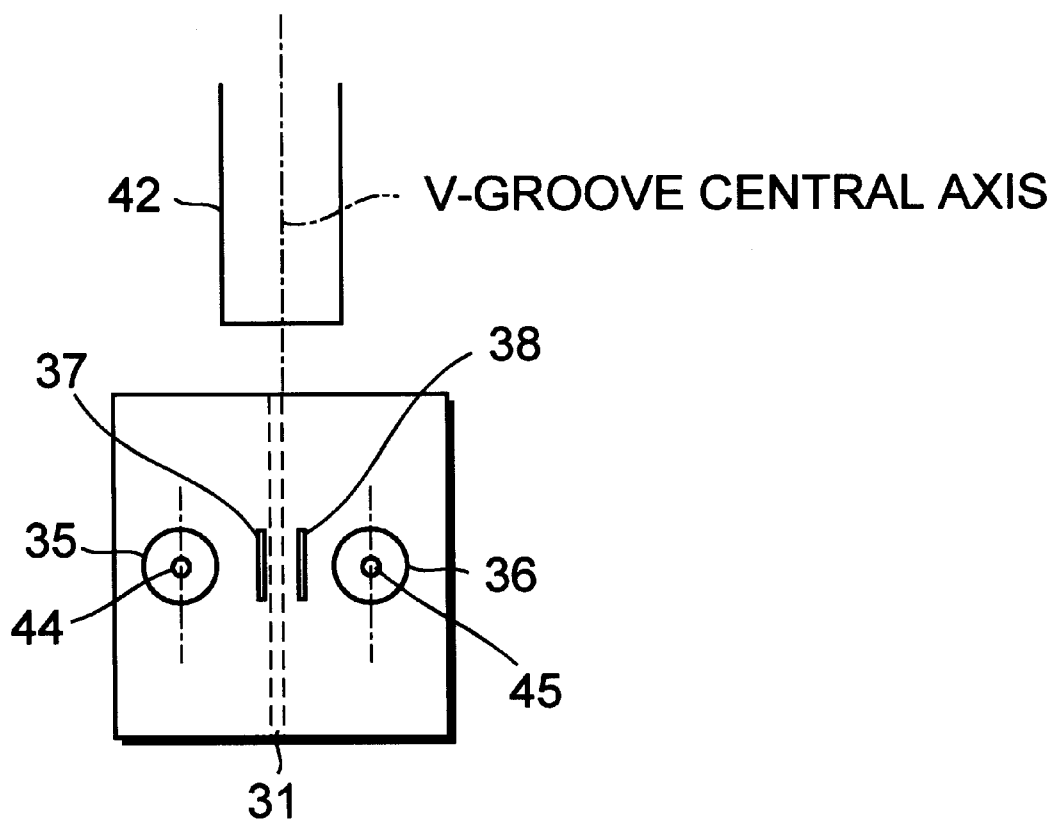
FIG. 9 is a view showing a positioning process of an LD chip in a mounting method of the LD chip of the present invention.
Figure 10:
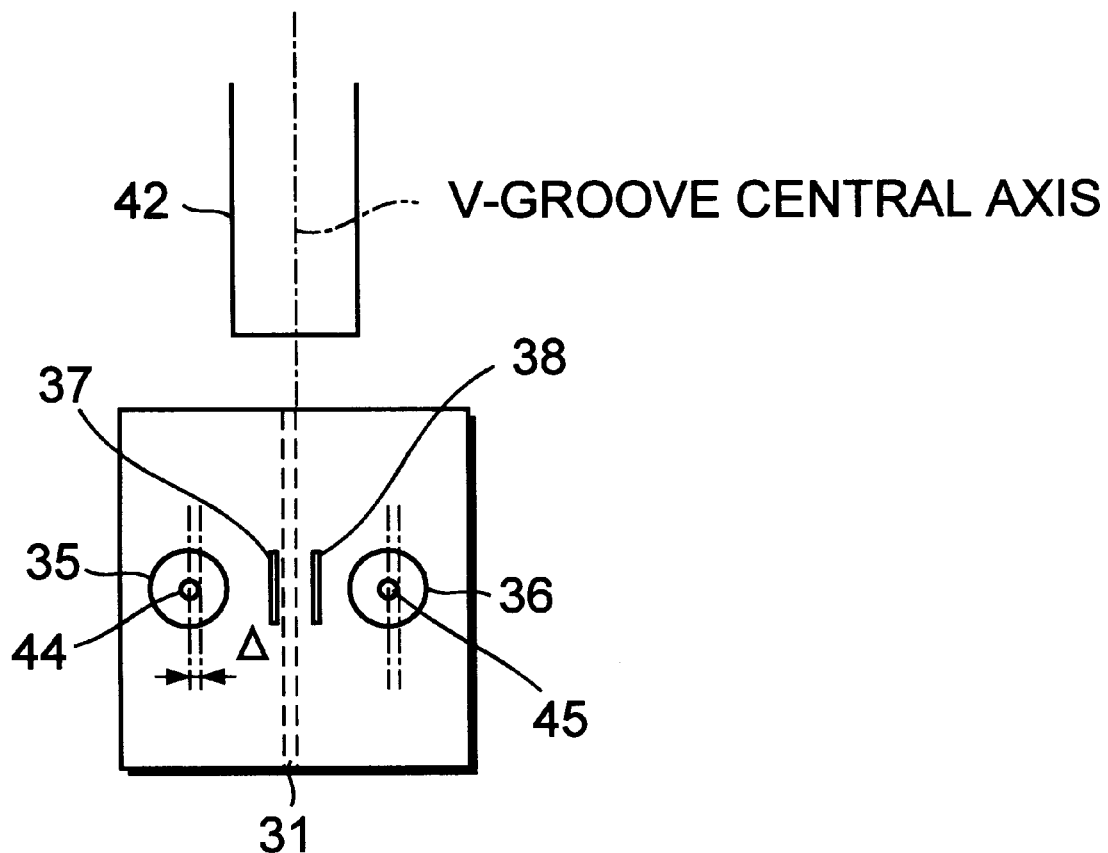
FIG. 10 is a view showing a positioning process of an LD chip in a mounting method of the LD chip of the present invention.

FIGS. 9 and 10 are views each showing positioning of the LD chip in the mounting method of the LD chip of the present invention. FIGS. 9 and 10 respectively show states before and after a position correction.

First, the LD chip is arranged on the substrate such that the marks 35, 36 for positioning in the LD chip and the positioning marks 44, 45 on the substrate side form a predetermined relation. Here, since both the positioning marks employ circular marks, the LD chip is positioned such that centers of these marks are in conformity with each other as shown in FIG. 9. Here, if the marks 35, 36 for positioning in the LD chip are formed at predetermined positions with respect to an active layer 31, the active layer 31 completely coincides with the central axis of the V-groove 42 when the LD chip is mounted and fixed to the substrate as it is.

However, as shown in FIG. 9, when the marks 35, 36 for positioning are shifted relatively to the right-hand side with respect to the active layer 31 seen from above in this figure, the LD chip is shifted to the left-hand side from a position of the central axis of the V-groove 42 if the LD chip is fixed as it is.

Therefore, the LD chip is moved to a position shifted by Δ to the right-hand side from the above position and is mounted and fixed in this state. Thus, the active layer 31 can completely coincides with the central axis of the V-groove 42.

As explained above, in accordance with the present invention, a mark for measurement which is positioned with respect to a positioning mark is arranged in a metallic layer in the vicinity of the active layer in the LD chip for a passive alignment, etc. A relative positions of the active layer and the positioning mark of the LD chip can be precisely measured by the mark for measurement.

Further, shifting amounts of relative positions of the positioning mark and the active layer can be easily grasped by arranging the mark for measurement just above the active layer. Further, relative position accuracy can be more easily grasped by setting a width of the mark for measurement to be equal to a width of the active layer.

A level difference can be reliably recognized by forming with a metallic layer a plurality of thin parallel straight lines as the mark for measurement so that the relative position of the mark for measurement to the active layer can be reliably measured. Thus, the LD chip can be mounted by correcting the relative positions s o that the LD chip is position ed with high accuracy to be mounted to the substrate. The LD chip and an optical waveguide, or an optical fiber arranged in the substrate, can be coupled to each other with high coupling efficiency.

FIG. 8 shows a construction for coupling the LD chip to the optical fiber arranged in th e substrate. However, the coupling can be similarly performed when the LD chip is mounted to the optical waveguide formed in the substrate instead of the optical fiber.

While this invention has been described in connection with certain preferred embodiments, it is to be understood that the subject matter encompassed by way of this invention is not to be limited to those specific embodiments. On the contrary, it is intended for the subject matter of the invention to include all alternative, modification and equivalents as can be included within the spirit and scope of the following claims.

What is claimed is:

1. A mounting method of a semiconductor laser diode chip having an active layer, for mounting the SEMICONDUCTOR LASER DIODE chip to a substrate at its predetermined position;

said semiconductor laser diode comprising:

a first mark formed in the vicinity of said active layer; and a second positioning mark with respect to said substrate;

said substrate having a substrate side mark formed at a position opposed to said second mark when said semiconductor laser diode chip is arranged in the predetermined position;

the mounting method including:

a process for measuring a position relation of said active layer and said second mark;

a process for setting said second mark and said substrate side mark to be opposed to each other and arranging said semiconductor laser diode chip in said substrate; and a process for correcting the position of said semiconductor laser diode chip on the basis of said position relation and fixing said semiconductor laser diode chip to said substrate.

2. A mounting method of a semiconductor laser diode chip as claimed in claim 1, wherein said second mark is constructed by a thin line pattern formed along said active layer in the vicinity of this active layer.

3. A mounting method of a semiconductor laser diode chip as claimed in claim 2, wherein said thin line pattern is constructed by a metallic film formed in plural thin parallel straight lines.

4. A mounting method of a semiconductor laser diode chip as claimed in claim 1, wherein said second mark is constructed by a thin line formed at an upper portion of said active layer.

5. A mounting method of a semiconductor laser diode chip as claimed in claim 4, wherein said second mark has approximately the same width as that of said active layer.

6. A mounting method of a semiconductor laser diode chip as claimed in claim 1, wherein said first mark is constructed by a pair of marks formed on both sides of said active layer.

7. A mounting method of a semiconductor laser diode chip as claimed in claim 6, wherein said first mark has a circular shape.

8. A mounting method of a semiconductor laser diode chip as claimed in claim 6, wherein said substrate side mark has a circular shape having a diameter different from that of said second mark.

9. A mounting method of a semiconductor laser diode chip as claimed in claim 1, wherein each of said first and second marks is constructed by a metallic thin film and is formed by the same process.

10. A mounting method of a semiconductor laser diode chip as claimed in claim 1, wherein said substrate has a V-groove the center of which coincides with the central axis of said active layer.

11. A mounting method of a semiconductor laser diode chip as claimed in claim 1, wherein a plurality of said substrate side marks and a plurality of said second marks are formed, respectively.

* * * * *